(12) United States Patent
Willett

(10) Patent No.: US 11,342,017 B2
(45) Date of Patent: May 24, 2022

(54) KEY-BASED MULTI-QUBIT MEMORY

(71) Applicant: Nokia Technologies Oy, Espoo (FI)

(72) Inventor: Robert L. Willett, Warren, NJ (US)

(73) Assignee: Nokia Technologies Oy, Espoo (FI)

( * ) Notice: Subject to any disclaimer, the term of this patent is extended or adjusted under 35 U.S.C. 154(b) by 95 days.

(21) Appl. No.: 16/655,675

(22) Filed: Oct. 17, 2019

(65) Prior Publication Data

US 2020/0135254 A1 Apr. 30, 2020

Related U.S. Application Data

(60) Provisional application No. 62/751,253, filed on Oct. 26, 2018.

(51) Int. Cl.

| | |
|---|---|
| *G11C 11/18* | (2006.01) |
| *G11C 11/40* | (2006.01) |
| *H01L 29/205* | (2006.01) |
| *H01L 29/778* | (2006.01) |
| *H01L 29/15* | (2006.01) |
| *H01L 29/66* | (2006.01) |
| H01L 43/06 | (2006.01) |
| G11C 11/16 | (2006.01) |

(52) U.S. Cl.
CPC ............. *G11C 11/40* (2013.01); *G11C 11/18* (2013.01); *H01L 29/151* (2013.01); *H01L 29/205* (2013.01); *H01L 29/66977* (2013.01); *H01L 29/778* (2013.01); G11C 11/1673 (2013.01); H01L 43/065 (2013.01)

(58) Field of Classification Search
CPC ... H01L 43/065; H01L 29/778; H01L 29/151; G11C 11/40; G11C 11/18
See application file for complete search history.

(56) References Cited

U.S. PATENT DOCUMENTS

| | | | |
|---|---|---|---|
| 6,936,841 B2 | 8/2005 | Amin et al. | |
| 7,394,092 B2 * | 7/2008 | Freedman | B82Y 10/00 257/14 |
| 7,576,353 B2 * | 8/2009 | Diduck | B82Y 10/00 257/29 |
| 8,190,553 B2 | 5/2012 | Routt | |
| 8,324,120 B2 | 12/2012 | Baldwin et al. | |
| 8,633,092 B2 | 1/2014 | Baldwin et al. | |

(Continued)

OTHER PUBLICATIONS

Nayak et al., "Non-Abelian Anyons and Topological Quantum Computation", published at arXiv:0707.1889v2 [cond-mat.str-el] Mar. 28, 2008, pp. 1-73.

(Continued)

*Primary Examiner* — Mushfique Siddique
(74) *Attorney, Agent, or Firm* — Nokia Technologies Oy

(57) ABSTRACT

A memory is capable of storing coupled qubits. The memory includes a plurality of memory cells, wherein each of the memory cells is for storing values of one of the qubits. The memory also includes an electronic controller electrically connected to operate said memory cells. The controller is able to selectively store a qubit value to any of the memory cells in either a first state or a second state. The controller is configured to read any one of the memory cells in a manner dependent on whether the first state or the second state was previously used to store a qubit value in the same one of the memory cells.

15 Claims, 7 Drawing Sheets

(56) References Cited

U.S. PATENT DOCUMENTS

| | | | |
|---|---|---|---|
| 8,987,703 | B2 | 3/2015 | Willett |
| 9,892,365 | B2 | 2/2018 | Rigetti et al. |
| 2010/0155697 | A1* | 6/2010 | Baldwin ............... H01L 43/065 257/14 |
| 2013/0140523 | A1* | 6/2013 | Willett ................... G06N 10/00 257/14 |
| 2015/0155478 | A1* | 6/2015 | Willett .................... H01L 43/04 438/3 |
| 2021/0247917 | A1* | 8/2021 | Willett ................. G06F 3/0629 |

OTHER PUBLICATIONS

Ambainis et al., "Dense Quantum Coding and Quantum Finite Automata", Journal of the ACM, vol. 49, No. 4, Jul. 2002, pp. 496-511.

Kyaw et al., "Scalable Quantum Memory in the Ultrastrong Coupling Regime", Scientific Reports, vol. 5, No. 8621, 2015, pp. 1-5.

Dennis et al., "Topological Quantum Memory", Journal of Mathematical Physics, vol. 43, No. 9, Sep. 2002, pp. 4452-4505.

U.S. Appl. No. 62/751,078, "Arrangement of Memory Cells For a Quantum-Computing Device", filed Oct. 26, 2018, 17 pages.

Camino et al., "Aharonov-Bohm Superperiod in a Laughlin Quasiparticle Interferometer", Physical Review Letters, vol. 95, 246802, Dec. 9, 2005, 4 pages.

Chamon et al., "Two Point-Contact Interferometer for Quantum Hail Systems", Physical Review B, vol. 55, No. 4, Jan. 15, 1997, pp. 2331-2343.

Sankar Das Sarma et al., "Topologically Protected Qubits from a Possible Non-Abelian Fractional Quantum Hall State", Physical Review Letters, vol. 94, 166802, Apr. 29, 2005, 4 pages.

Sanghun An et al., "Braiding of Abelian and Non-Abelian Anyons in the Fractional Quantum Hall Effect", arXiv:1112.3400v1 [cond-mat.mes-hall], Dec. 15, 2011, pp. 1-15.

Haldane et al., "Spin-Singlet Wave Function for the Half-Integral Quantum Hall Effect", Physical Review Letters, vol. 60, No. 10, Mar. 7, 1988 pp. 956-959.

A. Kitaev, "Fault-tolerant quantum computation by anyons", published at arXiv:quant-ph/9707021v1, Jul. 9, 1997, pp. 1-27.

Moore et al., "Nonabelions in the Fractional Quantum Hall Effect", Nuclear Physics, vol. B360, No. 2-3, Aug. 19, 1991, pp. 362-396.

Wen, "Non-Abelian Statistics in the Fractional Quantum Hall States", Physical Review Letters, vol. 66, No. 6, Feb. 11, 1991, pp. 802-805.

Willett et al., "Confinement of Fractional Quantum Hall States in Narrow Conducting Channels", Applied Physics Letters, vol. 91, 052105, 2007, 3 pages.

Willett et al., "Observation of an Even-Denominator Quantum Number in the Fractional Quantum Hall Effect", Physical Review Letters, vol. 59, No. 15, Oct. 12, 1987, pp. 1776-1779.

Wen, Non-Abelian Statistics in the Fractional Quantum Hall States', Preprint No. IASSNS-HEP-90/70, Institute of Advanced Study, Sep. 1990, pp. 1-7.

A. Kitaev, "Fault-Tolerant Quantum Computation by Anyons", Annals of Physics, vol. 303, 2003, pp. 2-30.

Nayak et al., "Non-Abelian Anyons and Topological Quantum Computation", Reviews of Modern Physics, vol. 80, No. 3, Jul.-Sep. 2008, pp. 1-77.

Tom SIMONITE, Intelligent Machines "Microsoft's Quantum Mechanics", MIT Technology Review, Oct. 10, 2014, pp. 1-11.

* cited by examiner

KEY-BASED MULTI-QUBIT MEMORY

This application claims the benefit of U.S. provisional patent application No. 62/751,253, filed Oct. 26, 2018, which is incorporated herein by reference in its entirety.

BACKGROUND

Technical Field

The invention relates to computational apparatus and methods of operating such apparatus.

Related Art

This section introduces aspects that may be help to facilitate a better understanding of the inventions. Accordingly, the statements of this section are to be read in this light and are not to be understood as admissions about what is prior art or what is not prior art.

Quantum computing devices have been made or proposed based on various technologies, e.g., superconducting junction devices, ion trap devices, and fractional quantum Hall effect (FQHE) devices. Computing devices typically use a memory to store a state value and hardware for writing the state value to the memory structure and for reading the state from the memory. Reliable methods for writing to the memory and reading from the memory are useful for various types of computing devices.

Devices have been proposed for quantum computation based on special FQHE states. In particular, FQHE states related to a filling factor of 5/2 have been suggested as possibly being useful for quantum computation devices. For some such states, interferometric devices have been suggested for defining the FQHE states, changing said states, and doing computation with said states. That is, an interferometric device can be used to write and read a quantum bit (i.e., a qubit) and to enable interactions so that different qubits are manipulated for quantum computation, e.g., in a quantum gate.

SUMMARY OF SOME ILLUSTRATIVE EMBODIMENTS

Various embodiments provide apparatus and methods that enable writing to, i.e., storing, and reading from a memory structure based on a fractional quantum Hall effect (FQHE) state. The FQHE states are various excitations of a laterally confined droplet of a 2-dimensional (2D) gas of charge carriers (2DGCC), e.g., electrons or holes, in a special FQHE state, e.g., the 5/2 filling factor state or the 12/5 filling factor state. The FQHE state may be incompressible, but still support various edge excitations that can store information and/or be manipulated.

In first embodiments, a memory for a storing a multi-qubit state includes an electronic controller and a set of memory cells having electrodes for laterally confining a two-dimensional charge carrier gas along a surface of a planar quantum well structure. Each of the memory cells has at least three regions for laterally confining parts of the gas, wherein the regions are connected by channels for the gas. The electronic controller is capable of selectively storing a qubit value to one of the memory cells in a first state by transferring a charge between a first pair of channel electrodes that control a first of the channels and alternatively storing the qubit value in a second state by transferring the charge between a second pair of channel electrodes that control a different second of the channels of the one of the memory cells. The electronic controller is configured to read the one of the memory cells by reducing an amount of the gas in one of the first and second of the channels using the pair of channel electrodes unselected to transfer the charge during a previous storing of a qubit value to the one of the memory cells.

In any of the first embodiments, the memory may be configured to maintain a droplet of the two-dimensional charge carrier gas in a fractional Hall effect state while qubit values are stored therein. Also, the fractional quantum Hall effect state may have, e.g., a Landau level filling factor of 5/2 or of 12/5.

In any of the first embodiments, the electronic controller may be configured to store a key identifying states previously used to store qubit values to individual ones of the memory cells and to determine the channels in which the amount of the gas is reduced during the read of the individual ones of the memory cells based on the stored key.

In a second embodiment, a memory is capable of storing coupled qubits. The memory includes a plurality of memory cells, wherein each of the memory cells is for storing values of one of the qubits. The memory also includes an electronic controller electrically connected to operate said memory cells. The controller is able to selectively store a qubit value to any of the memory cells in either a first state or a second state. The controller is configured to read any one of the memory cells in a manner dependent on whether the first state or the second state was previously used to store a qubit value in the same one of the memory cells.

In any of the second embodiments, the electronic controller may be configured to transfer a charge through a first pair of channel electrodes to store a one qubit value in the one of the memory cells in the first state and to transfer a charge through a different second pair of channel electrodes to store the same one qubit value in the second state in the one of the memory cells.

In any of the second embodiments, the electronic controller may be configured to maintain a key in a digital data storage device. The key identifies the states previously used to store qubit values in each of the memory cells. The electronic controller is configured to use the key to determine how to operate channels of the memory cells for subsequent reads of qubit values therein.

In any of the second embodiments, the memory may be configured to maintain a droplet of a two-dimensional charge carrier gas in a fractional Hall effect state while qubit values are stored therein. Also, the fractional quantum Hall effect state may have, e.g., a Landau level filling factor of 5/2 or of 12/5.

In any of the second embodiments, each one of the memory cells may include three or more regions for laterally confining parts of the droplet and channels for connecting the parts of the droplet in different ones of the regions of the same one of the memory cells. In such embodiments, the memory may further include electrodes to enable storage of a charge adjacent an interior portion of each of the regions.

In a third embodiment, a method includes measuring a set of qubit values stored in a plurality of coupled memory cells of a memory, wherein each of the memory cells stores a corresponding one of the qubit values of the set. The memory is able to selectively store a qubit value to any of the memory cells in a first state and to selectively store the same qubit value to the same of the memory cells in a different second state. The act of measuring of a qubit value stored in any one of the memory cells includes selecting between setting the one of the memory cells to function as a first interferometer and setting the one of the memory cells to function as a different second interferometer. Each of the interferometers is configured to interfere excitations of a droplet of a two-dimensional charged carrier gas in a fractional quantum Hall effect state. The act of selecting is based on an identification of the one of the states previously used to store a qubit value in the one of the memory cells.

In any third embodiments, the act of measuring may include selecting one of the interferometers based on channels for tunneling said excitations across the droplet of the selected one of the interferometers being different from a channel used to transfer a charge between channel electrodes during a previous storing of a qubit value to the one of the memory cells.

In any third embodiments, the method may further include maintaining the charge carrier gas in the fractional quantum Hall effect state having a Landau level filling factor of 5/2 or of 12/5.

In the Figures, relative dimension(s) of some feature(s) may be exaggerated to more clearly illustrate the feature(s) and/or relation(s) to other feature(s) therein.

In the various Figures, similar reference numbers may be used to indicate similar structures and/or structures with similar functions.

Herein, various embodiments are described more fully by the Figures and the Detailed Description of Illustrative Embodiments. Nevertheless, the inventions may be embodied in various forms and are not limited to the embodiments described in the Figures and the Detailed Description of Illustrative Embodiments.

DETAILED DESCRIPTION OF ILLUSTRATIVE EMBODIMENTS

The Detailed Description of the Illustrative Embodiments and drawings merely illustrate principles of the inventions. Based on the present specification, those of ordinary skill in the relevant art will be able to devise various arrangements that, although not explicitly described or shown herein, embody the inventions and are included within the scope of the claims. Also, statements herein reciting principles, aspects, and embodiments are intended to encompass equivalents thereof.

U.S. provisional patent application No. 62/751,078, filed on Oct. 26, 2018, is incorporated herein by reference in its entirety. The U.S. provisional patent application, incorporated by reference herein, in the present paragraph, describes some structures for memories and methods of use of memories, which may be useful in some embodiments described herein.

Herein, various memories for storing, reading, and manipulating a sequence of qubits use a laterally confined droplet of a 2-dimensional (2D) charge-carrier gas (2DCCG), e.g., an electron or hole gas, which is maintained in a special FQHE state. Typically, the 2DCCG is in a FQHE state for a fixed filling factor, e.g., 5/2 or 12/5, of Landau level(s) formed by a transverse applied magnetic field. To produce the FQHE state, the 2DCCG is also typically maintained at a low temperature e.g., less than 100, 50, or even 20 milli-Kelvin.

Memory Cell for a Single Qubit

Figure 1:
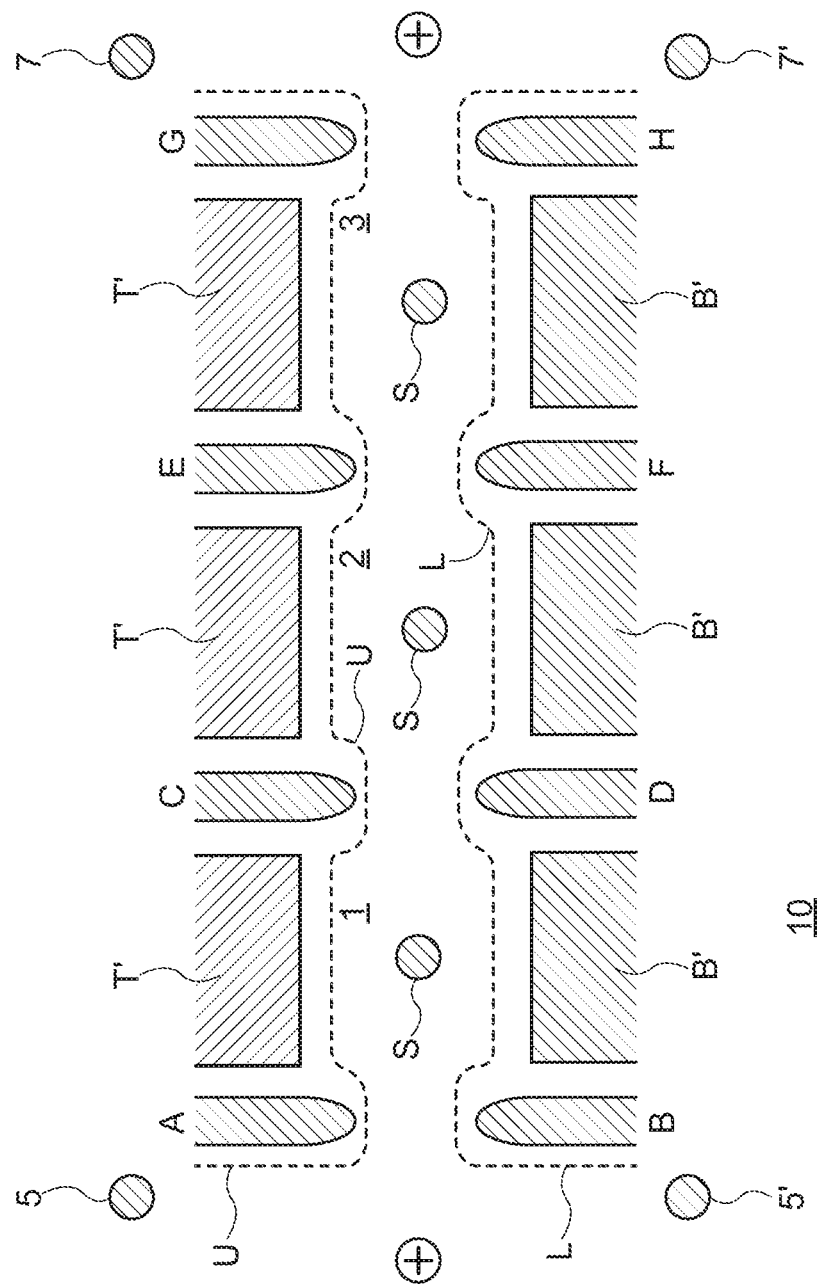
FIG. 1 is a schematic top view of a memory cell for storing a single qubit in a quantum computing device based on the fractional quantum Hall effect (FQHE)

FIG. 1 is a schematic top view of a memory cell 10, for storing a single qubit based on one of the above-mentioned FQHE states. The memory cell 10 includes an electrode pattern, i.e., hatched areas, on and/or over a top surface of a planar, semiconductor, quantum-well structure, e.g., partially visible as white areas of FIG. 1. The top surface typically extends perpendicular to the stacking direction of the semiconductor layers in the planar, semiconductor, quantum-well structure. Portions of the electrode pattern may be on the surface, and other portions of the electrode pattern may be near, but separated from, said top surface. For simplicity of illustration, all electrodes of the electrode pattern are shown as being on the top surface in FIG. 1. Some of the electrodes may be diffused into the semiconductor material to control the underlying FQHE state.

The planar, semiconductor, quantum-well structure is configured to vertically trap a 2D charge carrier gas (2DCCG) and has a suitable distribution of dopant atoms to provide the charge carrier gas. For example, the planar, semiconductor, quantum-well structure may have a 2D gallium arsenide (GaAs) well region vertically surrounded by aluminum gallium arsenide (AlGaAs) barrier layers and may have other layers carrying the dopant atoms that provide the charge carriers for the well region. The planar, semiconductor, quantum-well structure may also have a more complex multiple quantum-well structure to better screen defects related to charged dopant atoms, e.g., may include narrower screening quantum-wells surrounding the main quantum-well, and/or the planar, semiconductor, quantum-well structure may be based on layers of different semiconductor alloys. The 2DCCG is, e.g., an electron or hole gas vertically confined to the lowest level of such a 2D quantum-well.

As already mentioned, operation of the memory cell 10 involves confining a special FQHE state typically supporting non-abelian statistics. For example, the FQHE state is typically produced by having a magnetic field perpendicular to the top surface of the memory cell 10, i.e., indicated by +'s in FIG. 1, and by maintaining the memory cell 10 at low temperature, e.g., less than 100 or even less than 50 milli-Kelvin. Conditions are set up so that the 2DCCG fractionally fills the magnetic Landau level(s), e.g. to a selected filling factor, e.g., 5/2 or 12/5. For one or more of these filling factors, a laterally confined droplet of the 2DCCG behaves as an incompressible fluid with edge excitations and may support braiding operations for a non-abelian statistics.

U.S. Pat. Nos. 8,324,120, 8,987,703, and 8,633,092 describe examples of planar, semiconductor quantum-well structures and operating conditions that may be used in various embodiments. The United States patents of this paragraph are incorporated herein, by reference, in their entirety.

In the memory cell 10, the electrode pattern may be formed by a pattern of metal gate electrodes, which can be voltage biased to deplete areas below the electrode pattern of the 2DCCG and thereby provide lateral confinement of a 2D droplet of the 2DCCG between said electrodes, which are located along and near the top surface of the planar, semiconductor, quantum-well structure. The upper and lower edges U, L of said 2D droplet are illustrated by dotted lines in FIG. 1.

In the memory cell 10, metal gate electrodes substantially laterally surround three or more separate lateral regions, i.e., three regions 1, 2, 3 are shown in FIG. 1. The collection of connected lateral regions, e.g., the regions 1, 2, and 3, are used for storing a single qubit and for manipulating the single qubit, e.g., to do braiding operation(s) thereon. The pattern of metal gate electrodes includes top electrodes T', bottom electrodes B', and channel electrodes A, B, C, D, E, F, G, H, which typically have narrow tips adjacent channels.

During operation, each of the three or more lateral regions 1, 2, 3 is controlled by the voltage biasing of top and bottom electrodes T', B' and the channel electrodes A-H, which can deplete underlying and adjacent regions of the 2DCCG thereby defining the lateral extend of the droplet of the 2DCCG along the top surface in the memory cell 10. Indeed, the biasing of said electrodes T', B' can be changed to move the upper and lower edges U, L of said droplet of the 2DCCG. The horizontal boundaries of the lateral regions 1, 2, 3 are defined by the voltage biasing of channel electrodes A-H, which have narrow channels between facing pairs thereof. The voltage biasing of facing pairs (A, B), (C, D), (E, F), (G, H) of said channel electrodes may be adjusted to narrow or widen one or more of the channels and to adjust the width of the droplet of the 2DCCG in the channels. Narrowing one of said channels can cause edge excitations to tunnel between the upper U and lower L edges of the laterally confined droplet of the 2DCCG in or near said channel when the droplet is in a substantially incompressible FQHE state. Also, narrowing such a channel can enable a charge to be transferred between a facing pair (A, B), (C, D), (E, F), (G, H) of the channel electrodes.

In some embodiments, one or more small or point-like electrodes (not shown) may be located between one or more of the facing pairs of the channel electrodes, i.e., (A, B), (C, D), (E, F), and (G, H), to enable control of the amount of tunneling of charge therebetween. Said small or point-like electrodes may also be separately voltage biased able to better control said tunneling.

Each latera, region, e.g., the three regions 1-3, has, at least one, small electrode S, e.g., a point-like or disk-shaped electrode at the interior thereof. Said small electrodes S may be in contact with or slightly above the top surface of the planar, semiconductor, quantum-well structure. For example, there may be an air gap between the small electrodes S and the top surface. Said small electrodes S enable storage of charges in the individual lateral regions, e.g., the regions 1-3. The stored charges enable performance of operations, e.g., braid group operations, on the portion of the droplet of the 2DCCG located in the memory cell 10 when said droplet is maintained in a FQHE state supporting nonabelian statistics, e.g., at 5/2 or 12/5 filling factors. During operation, these small electrodes S may, e.g., not be biased to fully deplete the adjacent area of the planar, semiconductor, quantum-well structure of the 2DCCG.

U.S. Pat. Nos. 8,324,120, 8,987,703, and 8,633,092 describe some patterns of electrodes and the fabrication thereof, which may be useful for some of the electrodes of the present embodiments.

Finally, the memory cell 10 typically includes a left pair of measurement electrodes (5, 5') and a right pair of electrodes (7, 7') located to measure currents carried between the upper and lower edges U, L of the droplet of the 2DCCG at the respective left and right sides of the memory cell 10. Said measurement electrodes 5, 5', 7, 7' may have various shapes, sizes, and locations.

In other embodiments (not shown in FIG. 1), a memory cell for a single qubit may have a physical sequence of four or more separate regions for laterally confining a portion of the droplet of the 2DCCG along the top surface of a planar, semiconductor, quantum-well structure as described with respect to FIG. 1. In such embodiments, each of the four or more separate regions includes top and bottom electrodes T', B' for controlling the upper and lower edges U, L of the droplet of the 2DCCG, e.g., as described for the lateral regions 1-3 of FIG. 1. Also, each of the four or more regions has a channel at opposite sides thereof, and each channel is controlled by a pair of facing channel electrodes, e.g., as described for the channel electrodes A-H of FIG. 1. Also, each adjacent pair of the four or more regions is connected by a narrow channel, and other narrow channels connect the sequentially first and last of the regions to lateral areas of the planar, semiconductor, quantum-well structure, e.g., as shown for the regions 1-3 in FIG. 1. Also, each of the four or more regions includes a small electrode near a central area therein, e.g., as described for the small electrodes S and regions 1-3 of FIG. 1. Said small electrodes may store an electrical charge to enable braid operations upon the portion of the FQHE state in such a memory cell. Finally, such an embodiment of a memory cell also has electrode pairs lateral to the four or more regions for use in measuring resistances between upper and lower edges of the portion of the droplet of the 2DCCG laterally confined in the memory cell, as described for electrode pairs (5, 5') and (7, 7') in FIG. 1.

Storing and Reading a Single Qubit

Figure 2A:
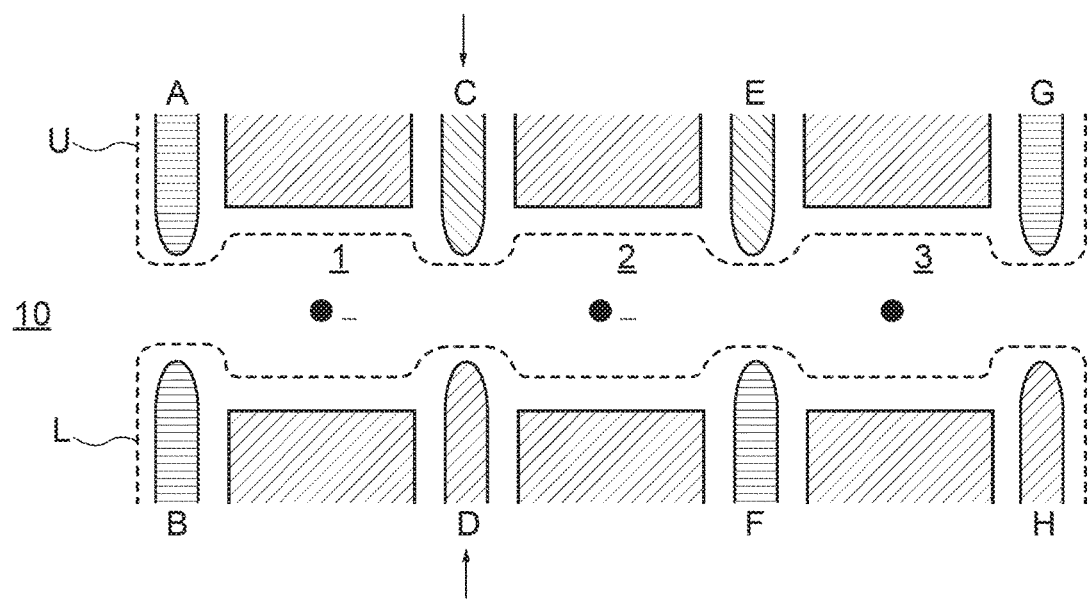
FIGS. 2A and 2B are top views schematically illustrating first methods for respectively, writing a qubit to and reading a qubit from the memory cell of FIG. 1.
Figure 2B:
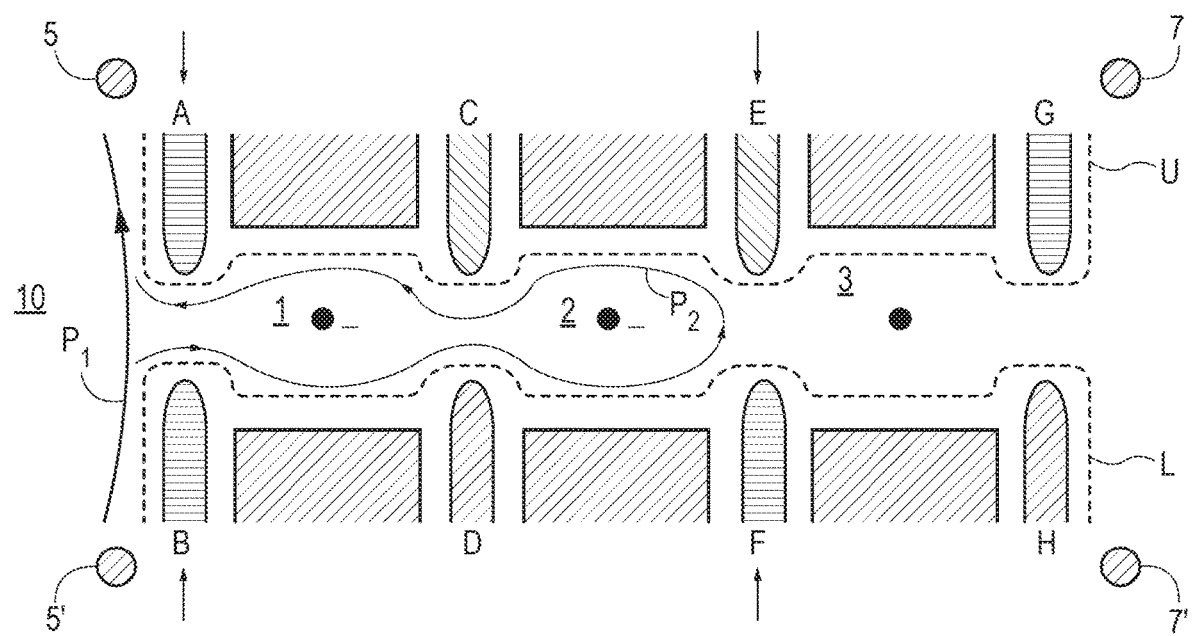

The various embodiments of a memory cell for a single qubit are capable of storing each value of the qubit in, at least, two different alternate manners. For example, the memory cell 10 of FIG. 1 can store each value of the qubit via an X-state, as illustrated in FIGS. 2A-2B, or via a Y-state, as illustrated in Figures and 2A-3B. In the X and Y states, the small electrodes S of the two adjacent regions, i.e. the regions 1 and 2 or the regions 2 and 3, are biased to hold the same charge. For the 5/2 filling factor, FQHE state, the held charge may both be about e/4 where "e" is the electron charge, but the held charges may be different for other FQHE states. In each of the X and Y states, the remaining one of the three regions 1-3, i.e., the region 3 or 1, has its small electrode voltage biased to hold a different charge. For the 5/2 filling factor, FQHE state, the small electrode S of this remaining one of the regions 1-3 may not hold a charge.

FIGS. 2A-2B illustrate operation of the memory cell 10 in the X-state, for which the small electrodes S of the left and center regions 1 and 2 have about the same held charge, as indicated by – signs, e.g., e/4 for the 5/2 filling factor, FQHE state, the small electrode S of the right region 3 has a different held charge, e.g., no charge for the 5/2 filling factor, FQHE state.

FIG. 2A schematically illustrates how to change the value of the qubit, in the X-state, i.e., to write the qubit value. The write operation involves voltage biasing the channel electrodes C and D, i.e., indicated by facing arrows, to transfer between the electrodes C and D a suitable charge, e.g., e/4 or e/2 for the 5/2 filling factor, FQHE state. Such a voltage biasing typically also decreases the width of the droplet of the 2DCCG in the channel between the channel electrodes (C, D), which can couple excitations on upper and lower edges U, L of the droplet by tunneling. Thus, in the X-state, the facing pair of channel electrodes (C, D), between the two regions 1, 2, which have the same charge on the small electrodes S, may be operated to write a desired qubit value to the memory cell 10, e.g., the qubit value |0> or |1>.

FIG. 2B schematically illustrates one way to perform a read operation of a qubit value stored in the X-state, in the memory cell 10. The read operation involves operating the memory cell 10 as an interferometer and measuring one or more resistances, e.g., between the external electrode pair (5, 5'). During the read operation, facing pairs of channel electrodes (A, B) and (E, F) are voltage biased to decrease widths of the droplet of the 2DCCG in the channels therebetween, as indicated by pairs of arrows. Due to the decreased channel widths, edge excitations of the droplet of the 2DCCG can tunnel between the upper and lower edges U, L thereof in and near said channels. In particular, some edge excitations tunnel between the upper and lower edges U, L of the droplet between the pair of channel electrodes (A, B), as illustrated by path $P_1$. Other edge excitations tunnel between the lower and upper edges U, L of the droplet between the pair of channel electrodes (E, F). Thus, these later edge excitations flow over a path $P_2$, which encircles the part of the FQHE droplet in regions 1 and 2. Also, some edge excitations may loop over the path $P_2$, multiple times by tunneling between the upper and lower edges U, L of the droplet at or near both of said channels. At left portion(s) of the upper and lower edges U, L, the excitations following the paths $P_1$ and $P_2$, as well as multiple traverses of the path $P_2$, interfere to define the electrical resistance between the left electrode pair (5, 5').

Since part of the interfering edge excitations have encircled the part of the FQHE droplet confined in the regions 1 and 2, the resistance between the electrodes 5, 5' depends on the stored qubit value. Since the channel between the facing pair of channel electrodes (C, D) has not been narrowed, such a read operation does not typically cause a charge transfer between the channel electrodes (C, D) and thus, does not typically change the stored qubit value. That is, such a read operation is a reliable operation, in the X-state.

Applicant notes that the qubit value, in the X-state, may alternatively be read by operating the facing pairs of channel electrodes (A, B) and (G, H) to narrow adjacent channels, e.g., for the 5/2 filling factor, FQHE state, to enable tunneling of edge excitations across said channels. Again, such read operation will not typically cause charge transfer across the wide channel between the facing pair of channel electrodes (C, D) and thus, would not likely destroy the stored qubit value.

Figure 3A:
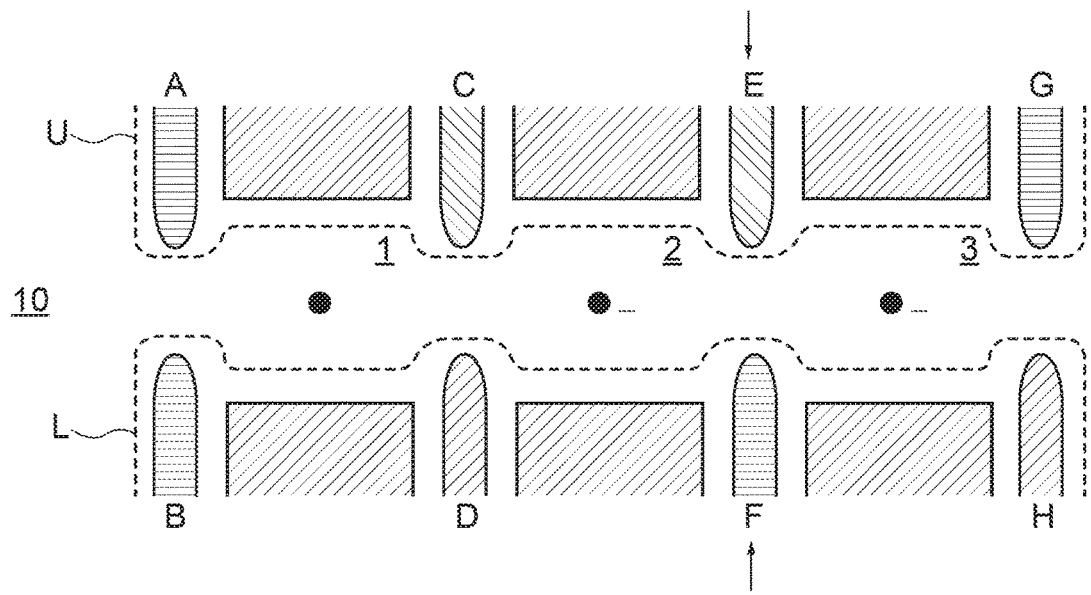
FIGS. 3A and 3B are top views schematically illustrating alternate second methods for respectively, writing a qubit to and reading a qubit from in the memory cell of FIG. 1.
Figure 3B:
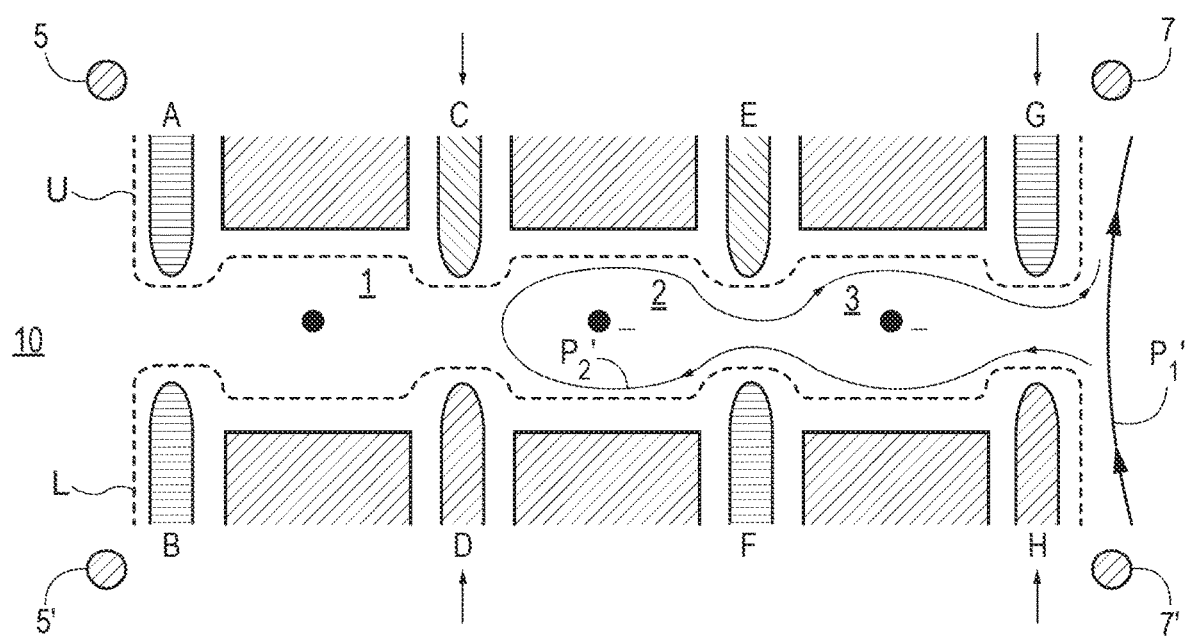

In the alternate Y-state FIGS. 3A-3B, the small electrodes S of both the center and right regions 2 and 3 have the same held charge, e.g., e/4 for the 5/2 filling factor, FQHE state, as indicated by − signs, and the small electrode S of the left region 1 has a different held charge, e.g., no charge for the 5/2 filling factor, FQHE state.

Referring to FIG. 3A, the value of the qubit value is changed or written, in the Y-state, by voltage biasing the channel electrodes E and F, as indicated by facing arrows, to transfer an appropriate charge. Such a transfer results from decreasing the width of the droplet of the 2DCCG in the channel between the facing channel electrodes E and F. Thus, in the Y-state, the facing pair of channel electrodes (E, F), between the two regions 2, 3 having the same charge on the small electrodes S therein, may be operated to "write" a desired qubit value to the memory cell 10, e.g., the qubit value |0> or |1>.

FIG. 3B schematically illustrates one way to perform a read operation of a qubit value stored in the Y-state, in the memory cell 10. The read operation involves operating the memory cell 10 as an interferometer and measuring one or more resistances, e.g., between the electrode pair (7,7'). During the read operation, facing pairs of channel electrodes (G, H) and (C, D) are voltage biased to decrease widths of the droplet of the 2DCCG in the channels therebetween, as indicated by pairs of arrows. Due to the decreased channel widths, edge excitations of the droplet of the 2DCCG can tunnel between the upper and lower edges U, L thereof in and near said channels. In particular, some edge excitations tunnel between the upper and lower edges U, L of the droplet between the pair of channel electrodes (G, H), as illustrated by path $P_1'$. Other edge excitations tunnel between the lower and upper edges U, L of the droplet between the pair of channel electrodes (C, D). Thus, these later edge excitations flow over a path $P_2'$, which encircles the part of the FQHE droplet in regions 2 and 3. Also, some edge excitations may loop over the path $P_2'$, multiple times by tunneling between the upper and lower edges U, L of the droplet at or near both of said channels. At right portion(s) of the upper and lower edges U, L, the excitations following the paths $P_1'$ and $P_2'$, as well as multiple traverses of the path $P_2'$, interfere to define the electrical resistance between the left electrode pair (7, 7').

Since part of the interfering edge excitations have encircled the part of the FQHE droplet confined in the regions 2 and 3, the resistance between the electrodes 7, 7' depends on the stored qubit value. Since the channel between the facing pair of channel electrodes (E, F) has not been narrowed, such a read operation does not typically cause a charge transfer between the channel electrodes (E, F) and thus, does not typically change the stored qubit value. That is, such a read operation is a reliable operation, in the Y-state.

Applicant notes that the qubit value, in the Y-state, may alternatively be read by operating the facing pairs of channel electrodes (A, B) and (G, H) to narrow adjacent channels, e.g., for the 5/2 filling factor, FQHE state, to enable tunneling of edge excitations across said channels. Again, such read operation will not typically cause charge transfer across the wide channel between the facing pair of channel electrodes (E, F) and thus, would not likely destroy the stored qubit value.

Figure 4A:
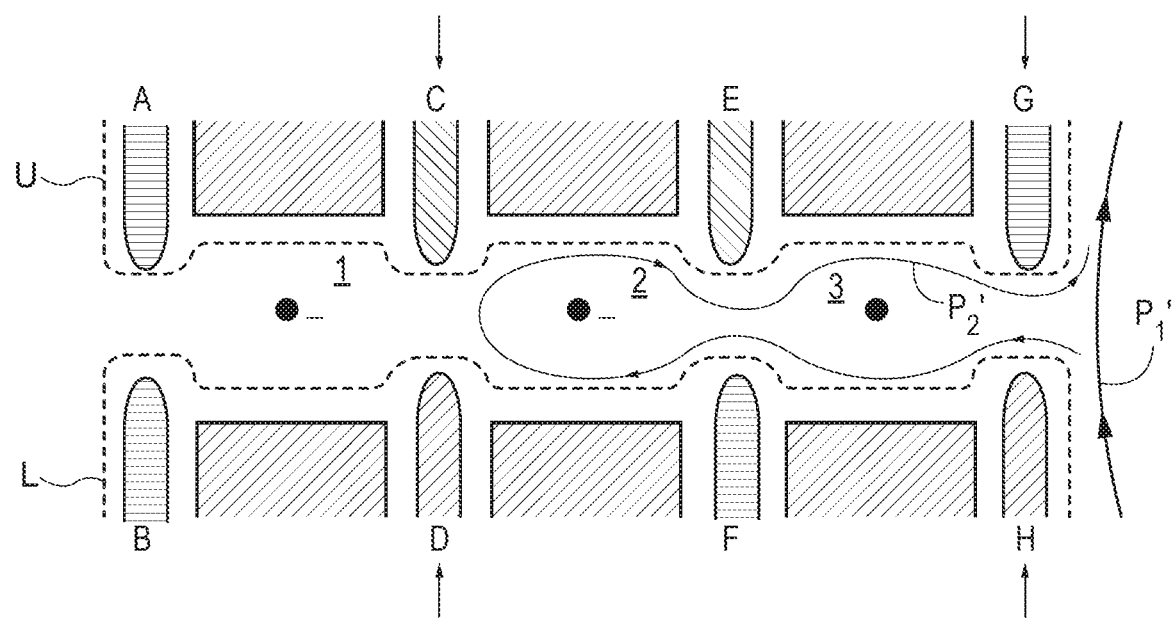
FIGS. 4A and 4B illustrate operations on the memory of FIG. 1, which may destroy or approximately randomize a value of the qubit stored therein.
Figure 4B:
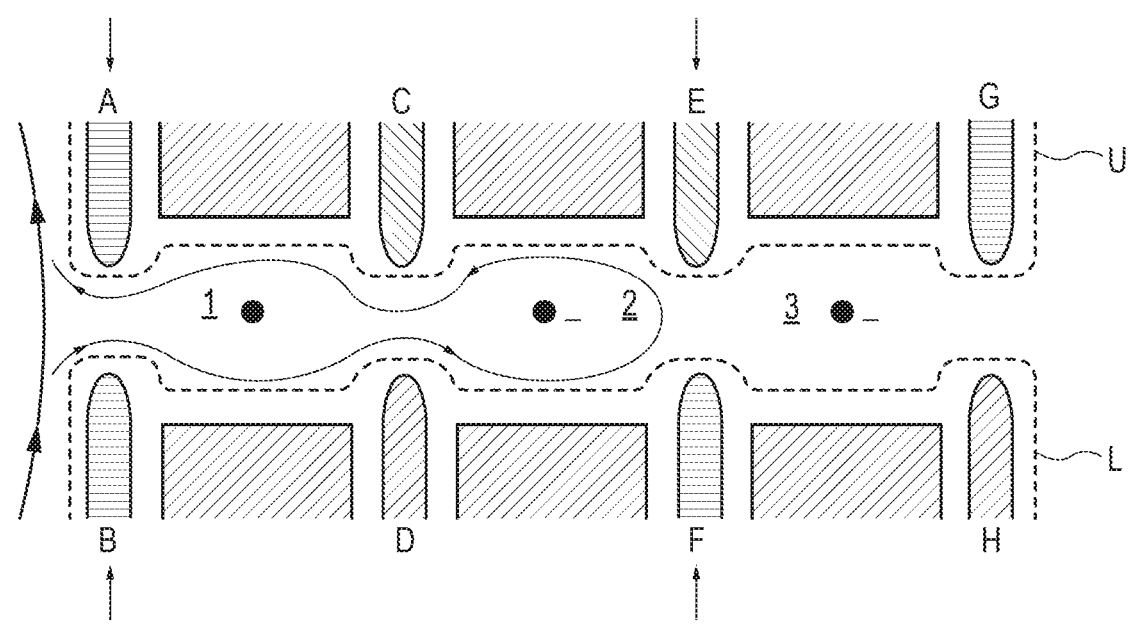

FIGS. 4A and 4B illustrate operations, which can change or approximately randomize the stored qubit value, in the X-state and Y-state, respectively. In FIG. 4A, the illustrated operation involves operating memory cell 10 to allow the tunneling of edge excitations between the facing pairs of the channel electrodes (C, D) and (G, H), i.e., as indicated by pairs of vertical arrows. Since such an operation also increases the probability of a charge transfer between the channel electrodes (C, D), the operation can change or randomize the stored qubit value, in the X-state. Thus, this operation is unsuitable for performing a read of the qubit value stored in the X-state. In FIG. 4B, the illustrated operation involves operating memory cell 10 to allow the tunneling of edge excitations between the facing pairs of the channel electrodes (E, F) and (A, B), i.e., as indicated by pairs of vertical arrows. Since such an operation also increases the probability of a transfer of charge between the channel electrodes (E, F), the operation can change or randomize a stored qubit value, in the Y-state. Thus, this operation is unsuitable for a read of a qubit stored in the Y-state. The examples of FIGS. 4A-4B illustrate that a knowledge of the identity of the storage state, e.g., X or Y, is typically needed to read the memory cell 10 by an operation without causing a likely change or a randomization of the stored value of the qubit.

Memories for Multiple Qubits

Figure 5:
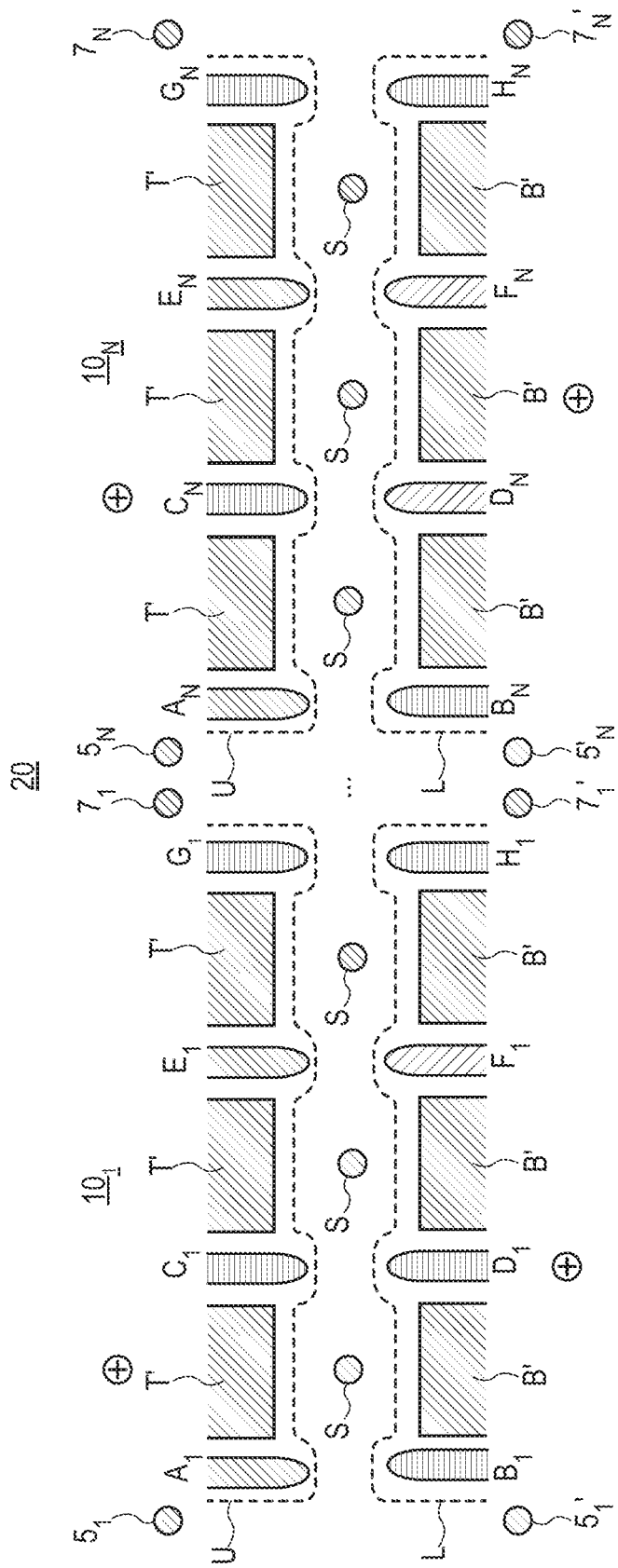
FIG. 5 is a top view schematically illustrating part of device for storing multiple qubits, e.g., in inter-coupled memory cells as illustrated in FIG. 1 or variants thereof.

FIG. 5 schematically shows a portion of a device 20 having a sequence of N coupled, memory cells $10_1 \ldots 10_N$, each for storing and manipulating a corresponding single qubit. One of, more than one of, or all of the individual memory cells $10_1 \ldots 10_N$ may be similar, in structure and operation, to the memory cell 10 of FIG. 1 or may be similar, in structure and operation, to memory cells having more separate lateral confinement regions, as already described herein. In the device 20, when maintained at a low temperature in a strong magnetic field, a FQH droplet, e.g., with the 5/2 filling factor or the 12/5 filling factor, may be spatially coherent between the various individual memory cells $10_1$-$10_N$ of the device 20 so that manipulations of said droplet may entangle the qubits stored in different ones of the memory cells $10_1$-$10_N$. In some other embodiments, one or more pairs of neighboring memory cells $10_1$-$10_N$ may share measurement electrodes $5_1 \ldots 5_N$, $5_1' \ldots 5_N'$, $7_1 \ldots 7_N$, $7_1' \ldots 7_N'$ and/or channel gates $A_1 \ldots A_N$, $B_1 \ldots B_N$, $G_1 \ldots G_N$, $H_1 \ldots H_N$ at adjacent boundaries thereof (not shown).

One or more of the individual memory cells $10_1 \ldots 10_N$ can be configured to enable selective writing of individual qubit values in either the X-state or the Y-state. Thus, the reliable reading of, writing to, and/or manipulation of qubits in such memory cells requires the use of information identifying the states, i.e., X or Y, during a previous or last storage or writing of the individual qubits therein. If all of the individual memory cells $10_1$-$10_N$ can store qubits in either the X-state or the Y-state, such information may take the form of an N-dimensional, ordered, binary-valued vector, i.e., a key, whose components indicate the storage state, e.g., X or Y. If only M of the individual memory cells $10_1 \ldots 10_N$ can selectively store a qubit in either the X-state or the Y-state, the key may take the form of an M-dimensional, ordered, binary-valued vector. Then, the value of the k-th component of the key may indicate, e.g., whether the k-th individual memory cell, which is capable of such a storage or write selection, last stored or wrote a qubit value in the X-state or the Y-state. A reliable read, write, or manipulation of the qubit of the k-th individual memory cell would typically involve first reading or using the k-th component of said key to identify the proper procedure for reading or manipulating the qubit of the k-th individual memory cell.

Below, this application mentions memories with memory cells, for which a qubit value can be stored selectively in an X-state or a Y-state. This application and the claims therein are meant to cover memories for which all of or only a part of the individual memory cells therein can store or write a qubit value selectively either in an X-state or in a Y-state.

Figure 6:
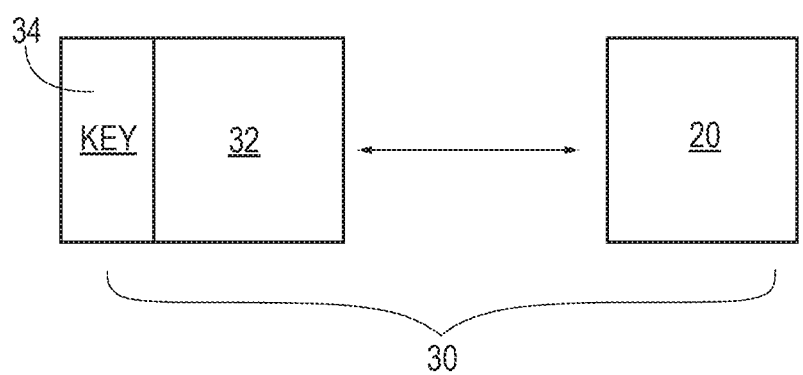
FIG. 6 schematically illustrates a quantum memory based on the device of FIG. 5.

FIG. 6 schematically illustrates a memory 30 based on the device 20 of FIG. 5. The memory 30 includes the device 20 and an electronic controller 32. The electronic controller 32 is capable of electrically reading, writing, and manipulating the qubits of the individual memory cells $10_1 \ldots 10_N$ of the device 20. In particular, the electronic controller 32 can selectively operate various ones of the individual memory cells $10_1 \ldots 10_N$ to selectively store or write qubit values in the X-state or the Y-state therein. For this reason, the electronic device 32 includes an ordinary digital data storage 34 device, which stores a key, i.e., a vector to be used to reliably read and manipulate the qubits stored in the individual memory cells. The key stores and provides information on the identity of the state, e.g., X or Y, which was last used to store or write qubit values in the individual memory cells $10_1 \ldots 10_N$.

Figure 7:
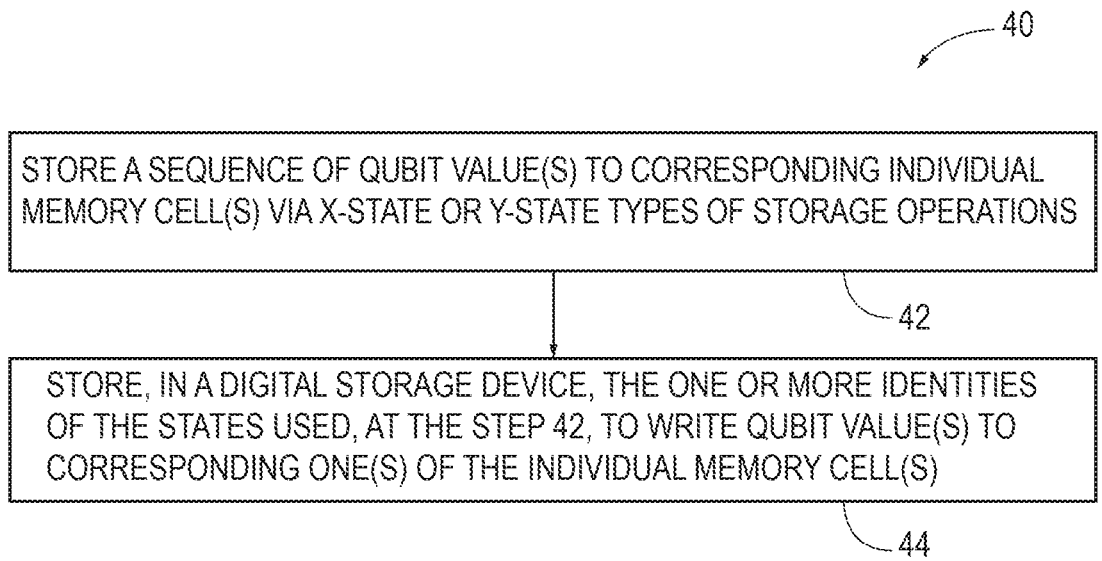
FIG. 7 is a flow chart illustrating a method of writing one or more qubits to a quantum memory, e.g., to the memory of FIG. 6.

FIG. 7 illustrates a method 40 of writing one or more qubits to a quantum memory, e.g., for using the electronic controller 32 to write qubit values to the device 20 in FIG. 6.

The method 40 includes storing a sequence of qubit value(s) to corresponding individual memory cell(s) via X-state or Y-state types of storage or write operations (step 42). In embodiments with multiple memory cells, the type of storage operation may be the same or may be different for different ones of the memory cells.

The method 40 includes storing, in a digital data storage device, the identities of the states, e.g., X or Y, which were used, at the step 42, to store or write qubit value(s) to corresponding one(s) of the individual memory cell(s) (step 44). The storing step 44 may include, for example, updating the component(s) of a key vector corresponding to memory cell(s) to which qubit values were last stored or written. The value of each of the components of the key identifies the state, e.g., X or Y, last used to store or write a qubit value to a corresponding one of the memory cells.

Figure 8:
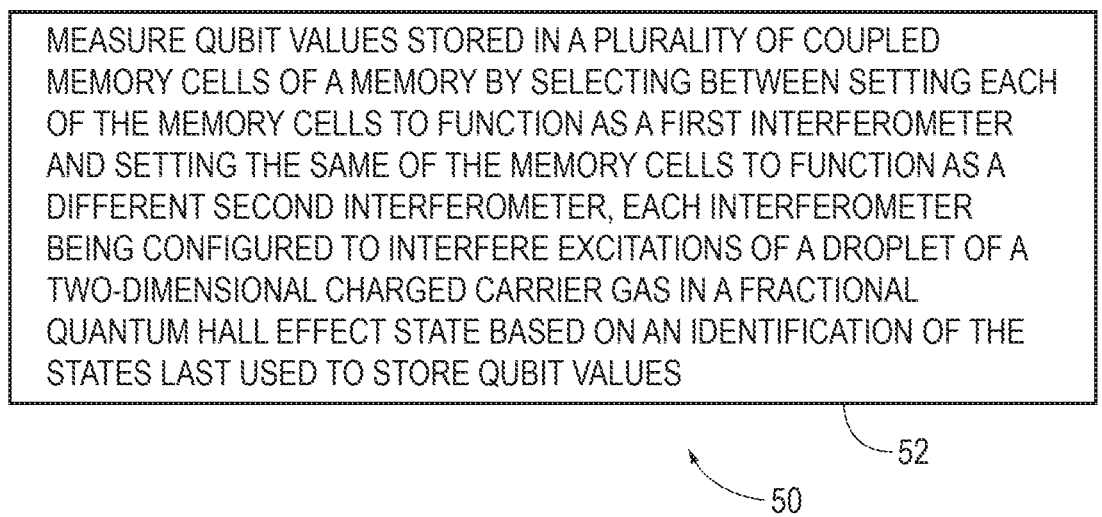
FIG. 8 is a flow chart illustrating a method of reading qubits from a quantum memory, e.g., the memory of FIGS. 6-7.

FIG. 8 illustrates a method 50 of reading part of or all of a multi-qubit memory, e.g., the memory device 20 of the memory 30 of FIG. 6 when already written as described in FIG. 7. Each memory cell of the memory device stores a corresponding one of the qubit values of the set. The memory can be selectively operated to store or write a qubit value to any memory cell thereof in a first state and can alternatively selectively operated to store the same qubit value to the same memory cell in a different second state.

The method 50 includes measuring a set of qubit values stored in a plurality of coupled memory cells of a memory (step 52). For each of the memory cells, the measuring step 52 includes selecting between setting the memory cell to function as a first interferometer and setting the same memory cell to function as a different second interferometer. Each of the interferometers are configured to interfere excitations of a droplet of a two-dimensional charged carrier gas in a fractional quantum Hall effect state, e.g., an electron gas, based on an identification of the state previously or last used to store qubit value(s) in the corresponding memory cell(s).

In some embodiments of the method 50, the measuring step 50 includes selecting one of the interferometers based on channels used to tunnel said excitations across the droplet of the selected one of the interferometers being different from a channel previously used to transfer a charge between channel electrodes during the previous or last storing or writing of a qubit value to the same memory cell.

In some embodiments, the method 50 further includes maintaining the charge carrier gas in the fractional quantum Hall effect state having a Landau level filling factor of 5/2 or 12/5 during the operation of the memory.

Some of the memories and the methods for writing and reading qubit values, as described in this application, may be useful as memories and methods for quantum computing devices, e.g., for quantum gates, quantum circuits, and/or quantum computers.

What is claimed is:

1. A memory for a storing a multi-qubit state, comprising:
an electronic controller;
a set of memory cells having electrodes for laterally confining a two-dimensional charge carrier gas along a surface of a planar quantum well structure, each of the memory cells having at least three regions for laterally confining parts of the gas, the regions being connected by channels for the gas;
wherein the electronic controller is capable of selectively storing a qubit value to one of the memory cells in a first state by transferring a charge between a first pair of channel electrodes that control a first of the channels and alternatively storing the qubit value in a second state by transferring the charge between a second pair of channel electrodes that control a different second of the channels of the one of the memory cells; and
wherein the electronic controller is configured to read the one of the memory cells by reducing an amount of the gas in a one of the first and second of the channels using the pair of channel electrodes unselected to transfer the charge during a previous storing of a qubit value to the one of the memory cells.

2. The memory of claim 1, wherein the memory is configured to maintain a droplet of the two-dimensional charge carrier gas in a fractional Hall effect state while qubit values are stored therein.

3. The memory of claim 2, wherein the fractional quantum Hall effect state has a Landau level filling factor of 5/2.

4. The memory of claim 1, wherein the electronic controller is configured to store a key identifying states previously used to store qubit values to individual ones of the memory cells thereof and to determine the channels in which the amount of the gas is reduced during reads of the individual ones of said memory cells based on the stored key.

5. A memory capable of storing coupled qubits, comprising:
a plurality of memory cells, each of the memory cells for storing values of one of the qubits; and
an electronic controller electrically connected to operate said memory cells;
wherein the controller is able to selectively store a qubit value to any individual of the memory cells in a first state and is able to selectively store the same qubit value to the same individual of the memory cells in a different second state; and
wherein the controller is configured to read any one of the memory cells in a manner dependent on whether the first state or the second state was previously used to store a qubit value in the same one of the memory cells.

6. The memory of claim 5, wherein the electronic controller is configured to transfer a charge through a first pair of channel electrodes to store a one qubit value in the one of the memory cells in the first state and to transfer a charge through a different second pair of channel electrodes to store the same one qubit value in the second state in the one of the memory cells.

7. The memory of claim 6, wherein the memory is configured to maintain a droplet of a two-dimensional charge carrier gas in a fractional Hall effect state while qubit values are stored therein.

8. The memory of claim 7, wherein the fractional quantum Hall effect state has a Landau level filling factor of 5/2.

9. The memory of claim 7, wherein the fractional quantum Hall effect state has a Landau level filling factor of 12/5.

10. The memory of claim 7, wherein each one of the memory cells includes three or more regions for laterally confining parts of the droplet and channels for connecting the parts of the droplet in different ones of the regions of the same each one of the memory cells.

11. The memory of claim 10, wherein the memory includes electrodes to enable storage of charges adjacent interior portions of each of the regions of the memory cells.

12. The memory of claim 11, wherein the memory is configured to maintain a droplet of a two-dimensional charge carrier gas in a fractional Hall effect state while qubit values are stored therein.

13. The memory of claim 12, wherein the fractional quantum Hall effect state has a Landau level filling factor of 5/2.

14. The memory of claim 12, wherein the fractional quantum Hall effect state has a Landau level filling factor of 12/5.

15. The memory of claim 5, wherein the electronic controller is configured to maintain a key in a digital data storage device, the key identifying the states previously used to store qubit values in each of the memory cells; and
wherein the electronic controller is configured to use the key to determine how to operate channels of the memory cells for subsequent reads of qubit values therein.

* * * * *